(12) United States Patent
Willey

(10) Patent No.: US 8,283,950 B2
(45) Date of Patent: Oct. 9, 2012

(54) DELAY LINES, AMPLIFIER SYSTEMS, TRANSCONDUCTANCE COMPENSATING SYSTEMS AND METHODS OF COMPENSATING

(75) Inventor: Aaron Willey, Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 40 days.

(21) Appl. No.: 12/854,749

(22) Filed: Aug. 11, 2010

(65) Prior Publication Data

US 2012/0038405 A1    Feb. 16, 2012

(51) Int. Cl.
*H02M 11/00* (2006.01)
*H03F 3/45* (2006.01)

(52) U.S. Cl. ............................ 327/103; 327/51; 327/109
(58) Field of Classification Search .................... 327/51, 327/103, 109; 365/207
See application file for complete search history.

(56) References Cited

U.S. PATENT DOCUMENTS

| | | |
|---|---|---|
| 4,284,957 A | 8/1981 | Haque |
| 4,502,020 A | 2/1985 | Nelson et al. |
| 4,555,673 A | 11/1985 | Huijsing et al. |
| 4,586,166 A | 4/1986 | Shah |
| 4,843,343 A | 6/1989 | Pace |
| 5,473,567 A | 12/1995 | McClure |
| 5,477,497 A | 12/1995 | Park et al. |
| 5,493,533 A * | 2/1996 | Lambrache .................. 365/175 |
| 5,504,442 A | 4/1996 | Tanoi |
| 5,514,986 A | 5/1996 | Tanoi |
| 5,654,928 A | 8/1997 | Lee et al. |
| 5,710,739 A | 1/1998 | Calligaro et al. |
| 6,127,853 A | 10/2000 | Yu |
| 6,141,246 A | 10/2000 | Derman et al. |
| 6,191,989 B1 * | 2/2001 | Luk et al. ...................... 365/207 |
| 6,326,815 B1 | 12/2001 | Sim et al. |
| 6,396,310 B2 | 5/2002 | Shin |
| 6,483,351 B2 | 11/2002 | Sim |
| 6,483,353 B2 | 11/2002 | Kim et al. |
| 6,617,885 B2 | 9/2003 | Lim et al. |
| 6,721,218 B2 | 4/2004 | Lim |
| 6,738,302 B1 | 5/2004 | Parris et al. |
| 6,879,217 B2 | 4/2005 | Visocchi |
| 6,879,533 B2 | 4/2005 | Chae et al. |
| 6,894,564 B1 | 5/2005 | Gilbert |
| 6,944,066 B1 | 9/2005 | Jing |
| 7,038,963 B2 | 5/2006 | Lee |
| 7,075,368 B2 | 7/2006 | Lin et al. |
| 7,154,331 B2 | 12/2006 | Zaguri |
| 7,262,638 B2 | 8/2007 | Shim |
| 7,286,011 B2 | 10/2007 | Chang et al. |
| 7,342,451 B2 | 3/2008 | Brueske |
| 7,446,609 B2 | 11/2008 | Lee et al. |

(Continued)

*Primary Examiner* — John Poos
(74) *Attorney, Agent, or Firm* — Dorsey & Whitney LLP

(57) ABSTRACT

Embodiments of delay lines may include a plurality of delay stages coupled to each other in series from a first stage to a last stage. Each delay stage may include an input transistor receiving a signal being delayed by the delay line. The delay line may include a compensating circuit configured to compensate for a change in a transconductance of the input transistor resulting from various factors. One such compensating circuit may be configured to provide a bias signal at an output node having a magnitude that is a function of a transconductance of a transistor in the compensating circuit. The bias signal may be used by each of the delay stages to maintain the gain of the respective delay stage substantially constant, such as a gain of substantially unity, despite changes in a transconductance of the respective input transistor in each of the delay stages.

9 Claims, 6 Drawing Sheets

U.S. PATENT DOCUMENTS

| | | |
|---|---|---|
| 7,477,076 B2 | 1/2009 | Miyatake |
| 7,521,992 B1 | 4/2009 | Hagleitner et al. |
| 7,564,295 B2 | 7/2009 | Ker et al. |
| 7,629,817 B2 | 12/2009 | Nedovic et al. |
| 7,777,568 B2 | 8/2010 | Lim |
| 7,990,792 B2 | 8/2011 | Abe et al. |
| 8,049,535 B2 | 11/2011 | Van Tran et al. |
| 2011/0182129 A1 | 7/2011 | Lee |
| 2011/0235450 A1 | 9/2011 | Lee et al. |

* cited by examiner

DELAY LINES, AMPLIFIER SYSTEMS, TRANSCONDUCTANCE COMPENSATING SYSTEMS AND METHODS OF COMPENSATING

TECHNICAL FIELD

Embodiments of this invention relate to methods of compensating, and, more particularly, in at least one embodiment, to analog delay lines and methods using differential amplifiers.

BACKGROUND OF THE INVENTION

Differential amplifiers are commonly used for a variety of purposes, including for delay stages in analog delay lines. In such analog delay lines, a plurality of differential amplifiers are coupled in series from a first differential amplifier to a last differential amplifier. A differential signal applied to differential inputs of the first differential amplifier may be successively delayed as it propagates through each of the differential amplifiers. As a result, a differential signal that is produced at differential outputs of the last differential amplifier may have a phase or timing that is delayed relative to the differential signal that is applied to the input of the first differential amplifier.

In some cases, it may be desirable for the differential signal coupled through the differential amplifiers of an analog delay line to have an amplitude that is as small as possible. A signal with a small amplitude may cause transistors used in the differential amplifier delay stages to consume less power than would be consumed by propagating a differential signal through the differential amplifiers having a larger amplitude. Further, a differential signal having a smaller amplitude may cause the magnitude of a delay provided by an analog delay line to be less sensitive to changes in a supply voltage used to power the analog delay line. For example, in its extreme example, a differential signal having a peak-to-peak amplitude equal to the difference between two supply voltages may cause the delay to vary substantially with the magnitude of the supply voltages since the differential signal propagating through the delay line may transition between the two supply voltages.

In practice, it may be difficult to set the amplitude of the differential signal to a minimum value that will propagate through the analog delay stages. Even if a differential signal having a small amplitude is applied to the first differential amplifier, if the differential amplifiers used as the delay stages have too much gain, the amplitude of the differential signal propagated through the delay line may progressively increase until it reaches a level that may result in excessive power consumption and sensitivity to power supply voltage changes. On the other hand, if the gain of the differential amplifier is too small, the differential signal propagated through the delay line may progressively decrease until it disappears. It may therefore be desirable to control the gain of differential amplifiers used in analog delay lines and other circuits to a fairly precise value.

The gain of one commonly used differential amplifier using a pair of differential input transistors is proportional to the transconductance of the transistors, which is often abbreviated as "gm." More specifically, in many such amplifiers, the gain is the product of gm and the impedance of a load, which may be a transistor or resistance. If the load is a resistance that does not change with such factors as semiconductor process variations, supply voltage variations, or temperature variations, the gain of a differential amplifier may be proportional to only the gm of the differential input transistors. If the gm of the differential input transistors can be precisely controlled so that the differential amplifier has a substantially unity gain, the signal propagated through an analog delay line using such differential amplifiers as its delay stages may have a minimum amplitude, thereby allowing the delay line to consume relatively little power and to be substantially insensitive to power supply and other variations.

Unfortunately, it may be difficult to control the gain of differential amplifiers in the presence of process, supply voltage and temperature variations. As a result, it may be necessary to apply a differential input signal to the first stage of an analog delay line having an amplitude that is large enough to ensure propagation through the delay line assuming worst case gains of the differential amplifier stages. The result may be a less than ideal power consumption and supply voltage susceptibility of the delay line.

DETAILED DESCRIPTION

Figure 1:
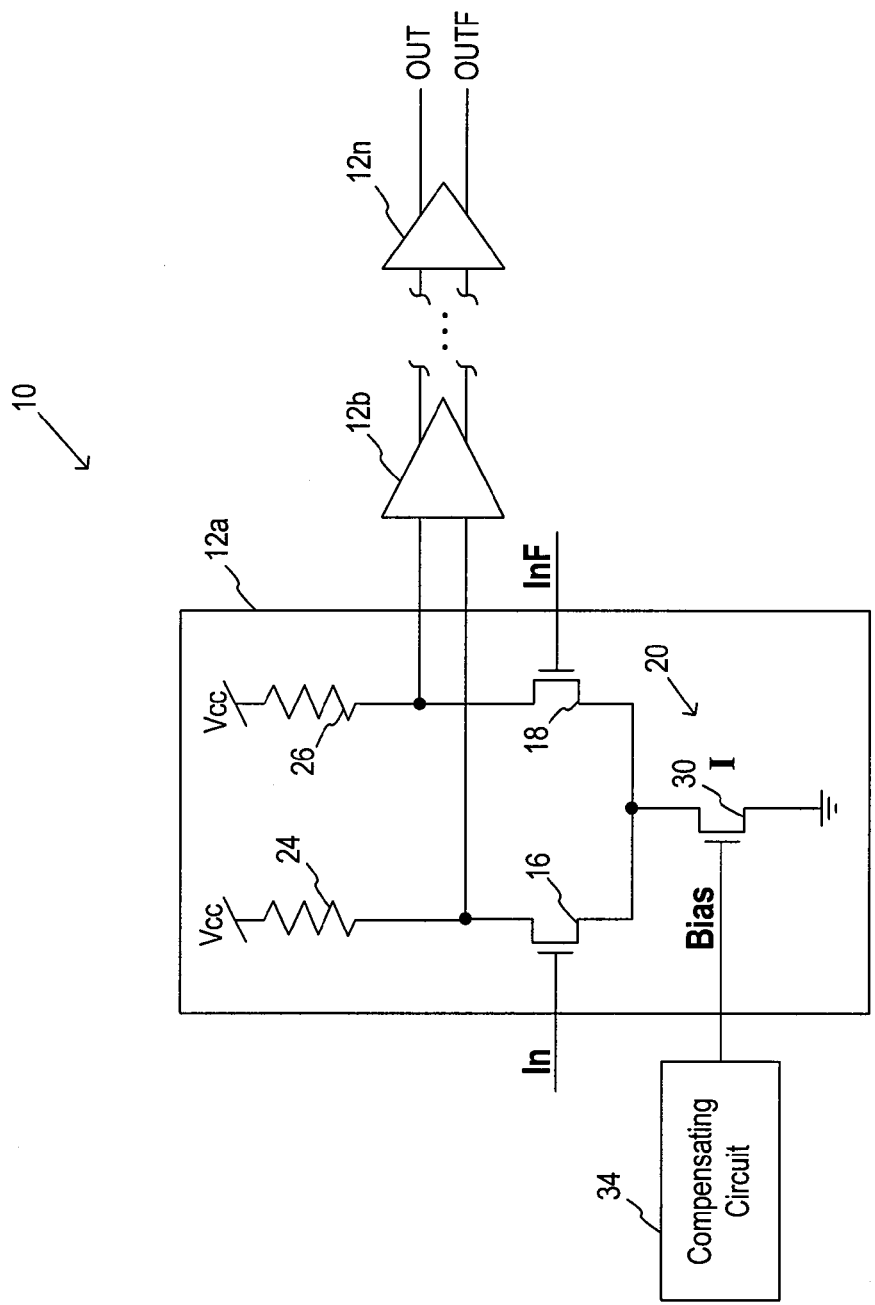
FIG. 1 is a schematic diagram of a prior art analog delay line.

An analog delay line 10 is shown in FIG. 1. The delay line 10 includes a plurality of differential amplifiers 12a,b . . . n that are coupled to each other in series between a first differential amplifier 12a and a last differential amplifier 12n. Each of the differential amplifiers 12a,b . . . n may be substantially identical to each other, so only one differential amplifier 12a is shown in detail in FIG. 1. Each differential amplifier 12 includes first and second input transistors 16, 18, which may be nFET input transistors as shown in FIG. 1. The respective sources of the input transistors 16, 18 may be coupled to each other and to a current sink 20. The drains may be coupled to a supply voltage Vcc through respective load resistances 24, 26. Finally, the gates of the input transistors 16, 18 may be coupled to receive respective differential input signals In and InF that are to be delayed. In operation, the input signals In and InF are delayed as they propagate through each of the differential amplifiers 12a . . . n to provide (e.g., generate) differential output signals Out, OutF at the drains of the respective input transistors 16, 18. As a result, the delay provided by the analog delay line 10 may, in part, be determined by the number of differential amplifiers 12 in the delay line 10.

As is well-known in the art, the gain "G" (i.e., the ratio of the differential output voltage Out−OutF to the differential input voltage In−InF) of the differential amplifiers 12 is given by the formula:

$$G = vin*gm*R\|Rt \qquad \text{[Equation 1]},$$

where Vin is the amplitude of the differential input signal, i.e., In–InF, gm is the transconductance of the input transistors 16, 18, R is the combined resistance of the load resistances 24, 26, Rt is the source-to-drain resistance of the transistors 16, 18, and R||Rt is the parallel resistance of R and Rt. In practice, the combined resistances 24, 26 may be much smaller than the source-to-drain resistance of the transistors 16, 18 so that R||Rt may essentially be equal to R. The transconductance gm is, in turn, a function of the current drawn through the input transistors 16, 18 by the current sink 20. As shown in FIG. 1, the current sink 20 may be implemented by a current sink transistor 30, such as an nFET transistor. Insofar as the gain G of each of the differential amplifiers 12 is a function of the magnitude of the current drawn by the current sink transistor 30, controlling the current drawn by the transistor 30 may facilitate maintaining the gain of the differential amplifiers 12 substantially constant. For this reason, prior art analog delay lines 10 may use a compensating circuit 34 to adjust the magnitude of a Bias voltage applied to the gate of the current sink transistor 30 for the purpose of maintaining the current drawn by transistor 10 constant.

Figure 2:
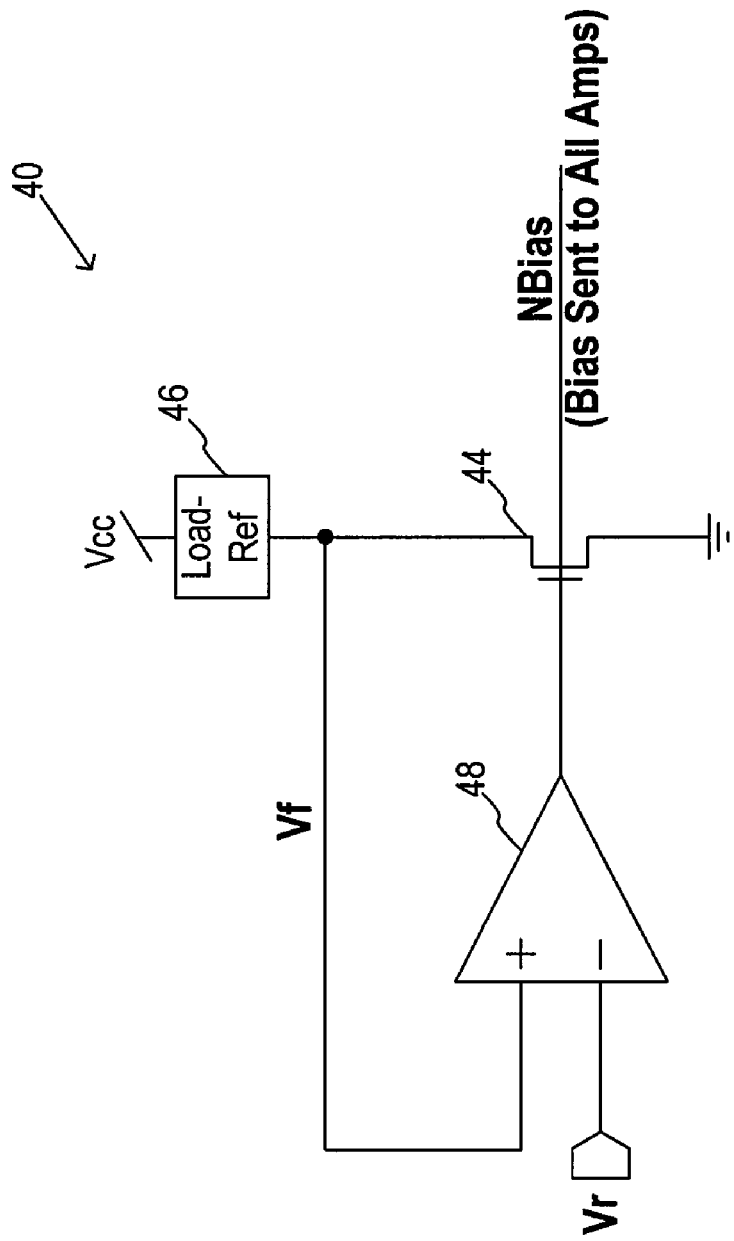
FIG. 2 is a prior art compensating circuit that may be used with the analog delay line of FIG. 1.

An example of a prior art compensating circuit 40 that may be used as the compensating circuit 34 is shown in FIG. 2. The compensating circuit 40 may include a transistor 44, such as a nFET transistor as shown in FIG. 2, which may be the same as the current sink transistor 30 and may be exposed to the same process, supply voltage and temperature as the transistor 30. The transistor 44 may have a source coupled to a first supply voltage, such as ground, and a drain coupled through a load 46, such as a resistance, to a second supply voltage, such as Vcc. A gate of the transistor 44 may be coupled to an output of a differential amplifier 48 that may have a first input coupled to receive a feedback voltage Vf from the drain of the transistor 44 and a second input coupled to receive a reference voltage Vr.

In operation, the magnitude of the feedback voltage Vf corresponds to the magnitude of the supply voltage Vcc less a voltage drop across the load 46. Insofar as the voltage drop across the load 46 is directly proportional to the current through the load 46, and hence the current drawn by the transistor 44, the magnitude of the feedback voltage Vf may be inversely proportional to the current drawn by the transistor 44. The current drawn by the transistor 44 may, in turn, be proportional to the transconductance gm of the transistor 44 and the voltage at the output of the differential amplifier 48. Thus, if the transconductance gm of the transistor 44 increases, the current drawn by the transistor 44 will increase, thereby decreasing the magnitude of the feedback voltage Vf so that it is less than the magnitude of the reference voltage Vr. As a result, the voltage at the output of the differential amplifier 48 will decrease, thereby reducing the voltage applied to the gate of the transistor 44. The current drawn by the transistor 44 will then decrease to increase the magnitude of the feedback voltage Vf. If the closed loop gain through the transistor 44 and differential amplifier 48 is sufficiently high, the voltage applied to the gate of the transistor 44 will be reduced to a level that causes the current through the load 46 to decrease sufficiently such that the feedback voltage is again substantially equal to the magnitude of the reference voltage Vr. The compensating circuit 40 operates in a similar manner in response to a decrease in the transconductance gm of the transistor 44. Thus, the magnitude of the current drawn by the transistor 44 is maintained substantially constant, i.e., at the current that causes the feedback voltage Vf to be substantially equal to the reference voltage Vr. The compensating circuit 40 may therefore ensure that the current drawn by the transistor 44 is substantially insensitive to changes in the transconductance gm of the transistor 44 resulting from various factors such as process variations in fabricating the transistor 44, the supply voltage Vcc, and the temperature of the transistor 44.

The transconductance gm of the transistor 44 may change in the same manner as the transconductance gm of a transistor used as the transistor 30 (FIG. 1) of the differential amplifiers 12 in the analog delay line 10. In such case, the analog delay line 10 may be made substantially insensitive to changes in the transconductance gm of the transistors 30 used in the delay line by applying the output of the differential amplifier 48 to the gates of the transistors 30. As a result, the gain of the differential amplifiers 12 used in the analog delay line 32 may be maintained at a relatively constant value despite variations in the gm of the current sink transistors.

Figure 3:
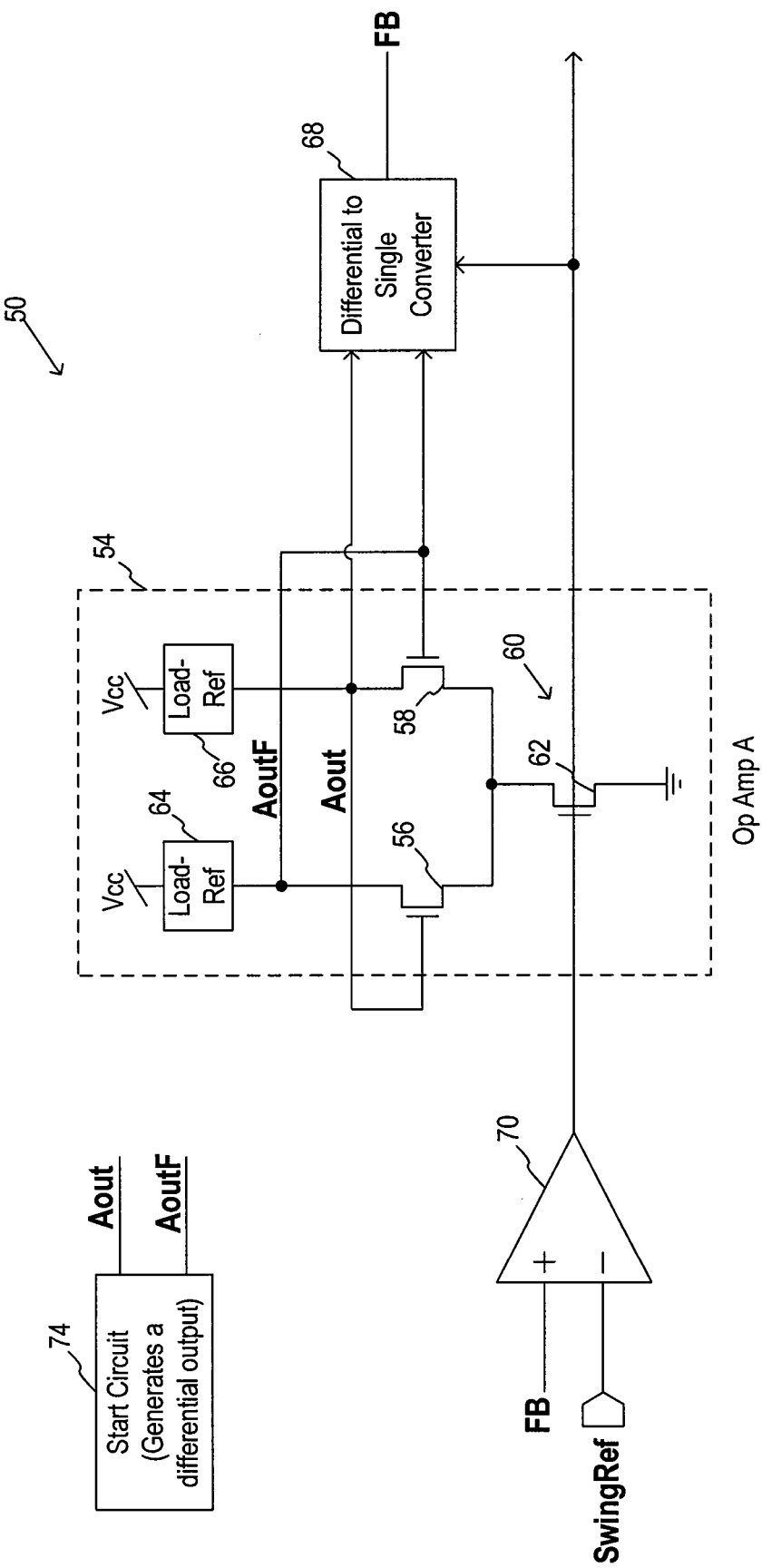
FIG. 3 is a schematic of an embodiment of a compensating circuit that may compensate for variations in the transconductance of input transistors in an analog delay line.

Although the compensating circuit 40 may be able to make the analog delay line 10 substantially insensitive to changes in the transconductance gm of the current sink transistors in the differential amplifiers 12, it may not compensate for changes in the transconductance gm of the input transistors 16, 18 used in the differential amplifiers 12. However, an embodiment of a compensating circuit 50 shown in FIG. 3 may compensate for changes in the transconductance gm of the input transistors 16, 18 used in the differential amplifiers 12 (FIG. 1). The compensating circuit 50 may include a bias voltage generator 54 having first and second input transistors 56, 58, which may be nFET input transistors as shown in FIG. 3. The input transistors 56, 58 may have substantially the same electrical characteristics, and may be formed using the same semiconductor material, as the input transistors 16, 18 used in an analog delay line with which the compensating circuit 50 is used. The respective sources of the input transistors 56, 58 may be coupled to each other and to a current sink 60, which may be a current sink transistor 62, such as a nFET transistor. The current sink transistor 62 may also have the same electrical characteristics, and may be formed using the same semiconductor material, as the current sink transistor 30 used in an analog delay line with which the compensating circuit 50 is used. The drains of the input transistors 56, 58 may be coupled to a supply voltage such as Vcc through respective loads 64, 66, which may be resistances. Finally, the gate of the input transistor 56 may be coupled to the drain of the transistor 58 to provide a first output signal Aout, and the gate of the input transistor 58 may be similarly coupled to the drain of the transistor 56 to provide a second output signal AoutF.

As further shown in FIG. 3, the output signals Aout and AoutF may be applied to respective inputs of a differential-to-single converter 68, which may provide a feedback voltage FB at its single output. The magnitude of the feedback voltage FB may be equal to the magnitude of the differential output voltage of the bias voltage generator 54, i.e., Aout–AoutF. The feedback voltage VB may be applied to a first input of a comparison circuit, such as a differential amplifier 70. A second input of the differential amplifier 70 may receive a reference voltage SwingRef, which, as explained in greater detail below, may be indicative of the desired peak-to-peak voltage of a differential signal propagating through an analog delay line with which the compensating circuit 50 is used. Finally, a start circuit 74 may be used to provide a differential output signal that is initially applied to the gates of the input transistors 56, 58 for reasons that will be explained below.

In operation, it is assumed that the gains of differential amplifiers used in an analog delay line should be unity so that the amplitude of a signal propagating through the delay line can be controlled with some degree of precision. If the gain is significantly greater than unity, a signal coupled though a delay line may progressively increase in magnitude until the signal transitions between Vcc and ground. Conversely, if the gain is significantly less than unity, a signal coupled though a delay line may progressively decrease in magnitude until it is no longer being propagated through the delay line. The voltage gain of the bias voltage generator 54 is inherently unity since voltage gain is defined as the ratio of the output voltage to the input voltage, and the differential output voltage Vout–VoutF is equal to the differential input voltage Vout–VoutF. As explained above, the gain G of the bias voltage generator 54 is given by the formula:

$$G = Vin * gm * R \| Rt \quad \text{[Equation 1]},$$

where Vin is the amplitude of the differential input signal, i.e., Aout–AoutF, gm is the transconductance of the transistors 56, 58, R is the combined resistance of the loads 64, 66, Rt is the output resistance of the transistors 56, 58, and R∥Rt is the parallel resistance of R and Rt, which, as also explained above, may be essentially equal to R if the resistance of the loads 64, 66 is made substantially greater than the output resistance of the transistors 56, 58. With a unity gain (G=1), and insofar as Vout=Vin Equation 1 can be rewritten as:

$$Vout = 1/[gm * R \| Rt] \quad \text{[Equation 2]}.$$

If the resistance of the loads 64, 66 is made substantially greater than the output resistance of the transistors 56, 58, Equation 3 can be reduced to:

$$Vout = 1/[gm * R] \quad \text{[Equation 3]}.$$

Thus, the differential output voltage Aout–AoutF can be set by selecting an appropriate resistance of the loads 64, 66 and gm of the transistors 56, 58, which can be adjusted by varying the current drawn by the current sink transistor 62.

In operation, the differential-to-single converter 68 provides a feedback voltage FB that corresponds to the differential output voltage of the bias voltage generator 54, i.e., Aout–AoutF. The differential amplifier 70 then adjusts the current drawn by the current sink transistor 62 to adjust the gm of the input transistors 56, 58 until the magnitude of the feedback voltage FB is substantially equal to the magnitude of the reference voltage SwingRef. Thus, since the feedback voltage FB corresponds to the differential output voltage of the bias voltage generator 54, i.e., Aout–AoutF, the gain of the bias voltage generator 54 may be automatically adjusted so that the gain is substantially unity at a specific differential output voltage. However, there may initially be no voltage difference between the voltages applied to the respective gates of the transistors 56, 58 (i.e., the differential input voltage may be zero) or the applied voltage may be of the wrong polarity. A start circuit 74 may therefore be provided to initially provide (e.g., apply, supply, output, etc.) a differential voltage to the gates of the transistors 56, 58 that ensures that the magnitude of Aout is greater than the magnitude of AoutF and of the correct polarity so that Aout is greater than AoutF. The magnitude of the voltage is not critical since the input/output voltages Aout, AoutF will automatically adjust to the correct values so that the gain of the bias voltage generator 54 is substantially unity.

Figure 4:
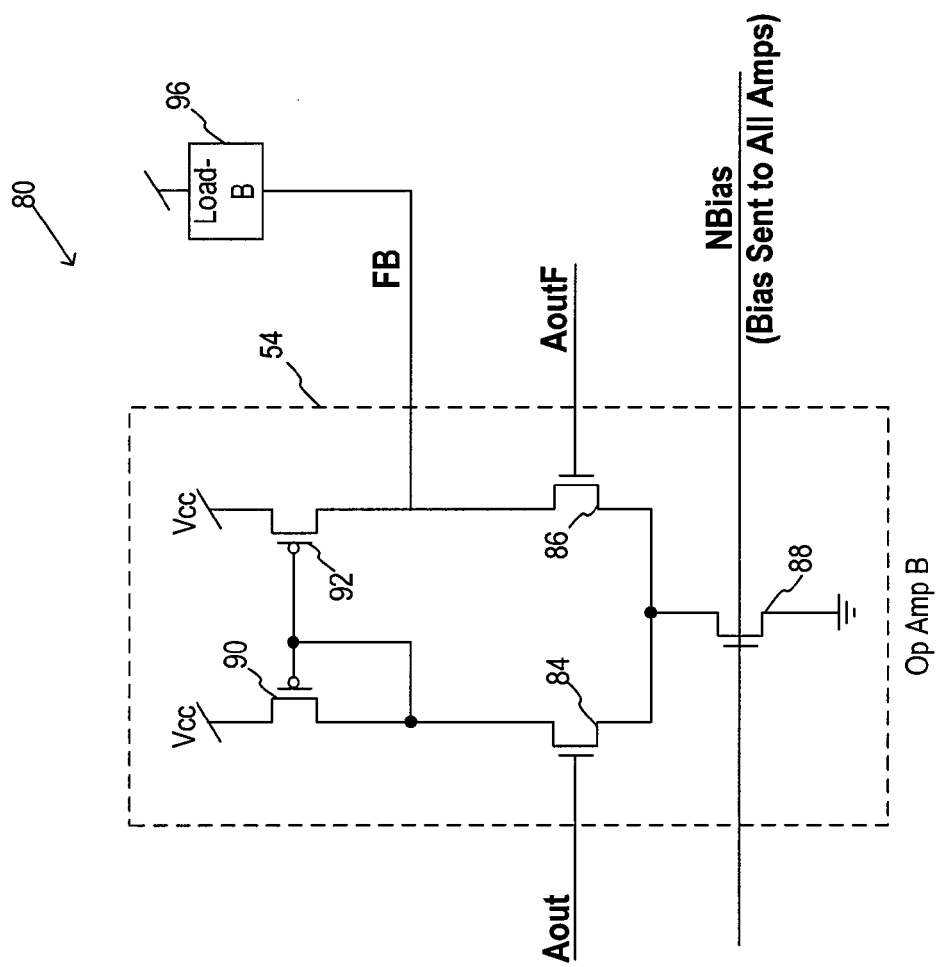
FIG. 4 is a schematic diagram of an embodiment of a differential-to-single converter that may be used in the compensating circuit shown in FIG. 3.

An embodiment of a differential-to-single converter 80, which may be used as the differential-to-single converter 68 shown in FIG. 3, is shown in FIG. 4. The converter 80 includes a pair of differential input transistors 84, 86, which may be nFET transistors, having respective drains that are coupled to each other and to the drain of a current sink transistor 88, which may also be a nFET transistor. The transistor 88 has a source coupled to a first supply voltage, such as ground, and a gate coupled to receive the Bias voltage provided by the bias voltage generator 54. The gate of each of the transistors 84, 86 is coupled to receive a respective signal Aout, AoutF from the bias voltage generator 54. Each of the transistors 84, 86 is coupled in series with a respective transistor 90, 92, which may be pFET transistors. The sources of the transistors may be coupled to a second supply voltage, such as Vcc, and the respective gates of the transistors 90, 92 may be coupled to each other and to the drain of the nFET transistor 84. The drain of the transistor 92 is coupled to the second supply voltage through a load 96, and it provides the feedback voltage FB that is fed back to the input of the differential amplifier 70 (FIG. 3). The transistors 84, 86, 88 may have substantially the same electrical characteristics, and may be formed using the same semiconductor material (e.g., in the same substrate), as the transistors 56, 58, 62, respectively, in the bias voltage generator 54.

In operation, if the magnitude of the feedback voltage FB may be indicative of, and varies inversely with, the magnitude of the differential input voltage Vout–VoutF, the differential-to-single converter 80 thus provides a single voltage FB corresponding to the magnitude of the different output voltage Vout–FoutF of the bias voltage generator 54.

Figure 5:
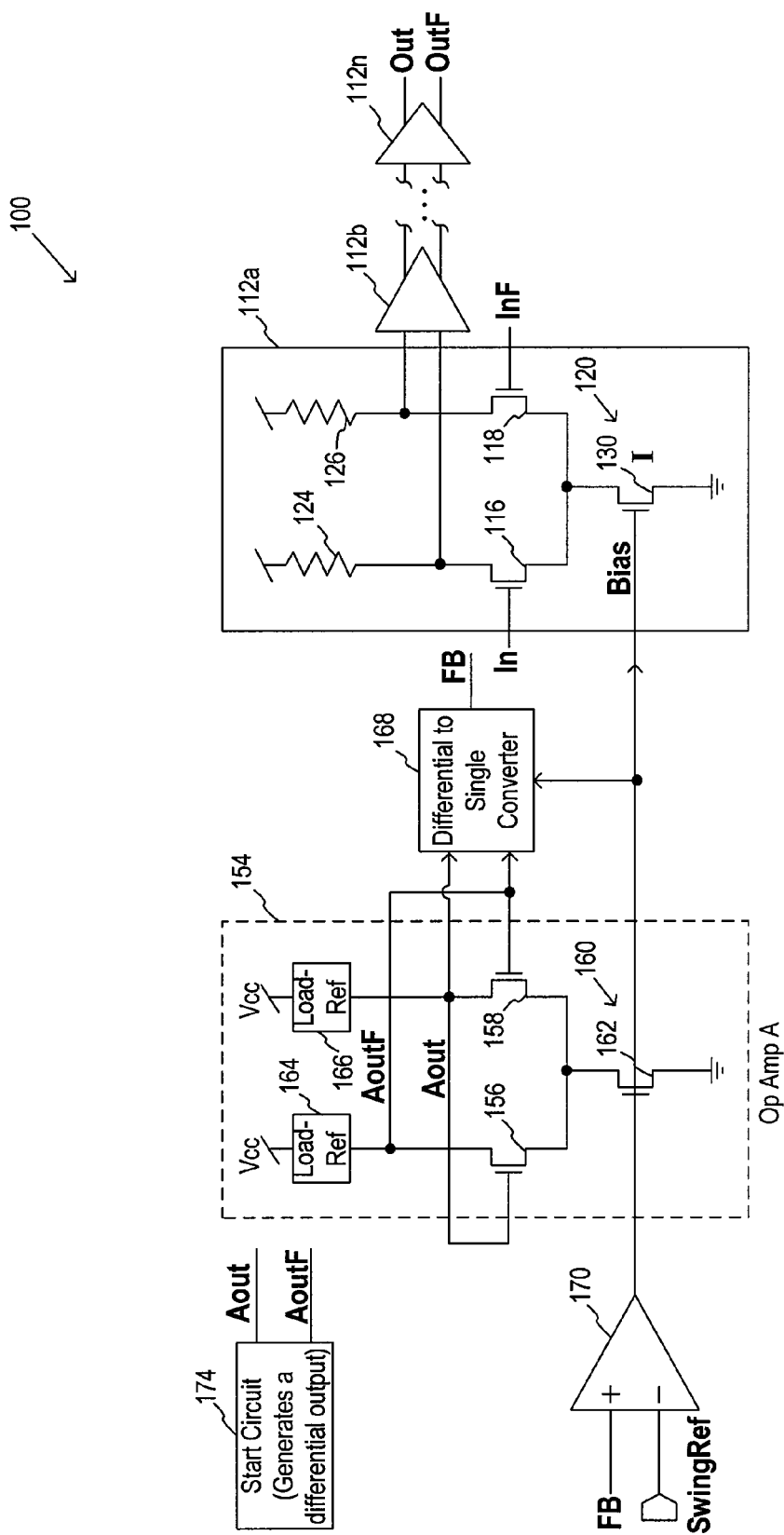
FIG. 5 is a schematic diagram of an embodiment of an analog delay line.

The compensating circuit 50 or a compensating circuit according to some other embodiment may be used with an embodiment of an analog delay line 100 as shown in FIG. 5. The analog delay line 100 may use a plurality of delay stages 112a, 112b . . . 112n, which may be the same as or different from the delay stages 12a,b . . . 12n used in the prior art delay line 10 of FIG. 1. As shown in FIG. 5, each of the delay stages 112a, uses a differential amplifier having input transistors 116, 118, which may be nFET transistors, a pair of load resistances 124, 126 and a current sink transistor 130. The transistors 116, 118, 130 may be the same as or different from the transistors 56, 58, 62, respectively, used in the bias voltage generator 54 of FIG. 3. However, the gate of the current sink transistor 130 receives the bias voltage BIAS provided by a compensating circuit 134, which, as mentioned above, may be the compensating circuit 50 or some other embodiment of a compensating circuit. The first delay stage 112a receives a differential input voltage In, InF, and the last delay stage 112n provides a differential output voltage Out, OutF that is delayed in time relative to the differential input voltage In, InF.

The manner in which the analog delay line 100 operates may be explained with reference to the chart shown in FIG. 6. The magnitude of the differential input voltage In–InF applied to each of the stages 112 of the analog delay line 100 is shown on the horizontal axis in opposite directions from the center (i.e., the voltage of In is plotted to the left of center and the voltage of InF is plotted to the right of center). The differential output voltage Out–OutF from each of the stages 112 is shown on the vertical axis from bottom to top. Each of the curves is indicative of the differential output voltage as a function of differential input voltage at a respective current drawn by the current sink transistor 130.

Figure 6:
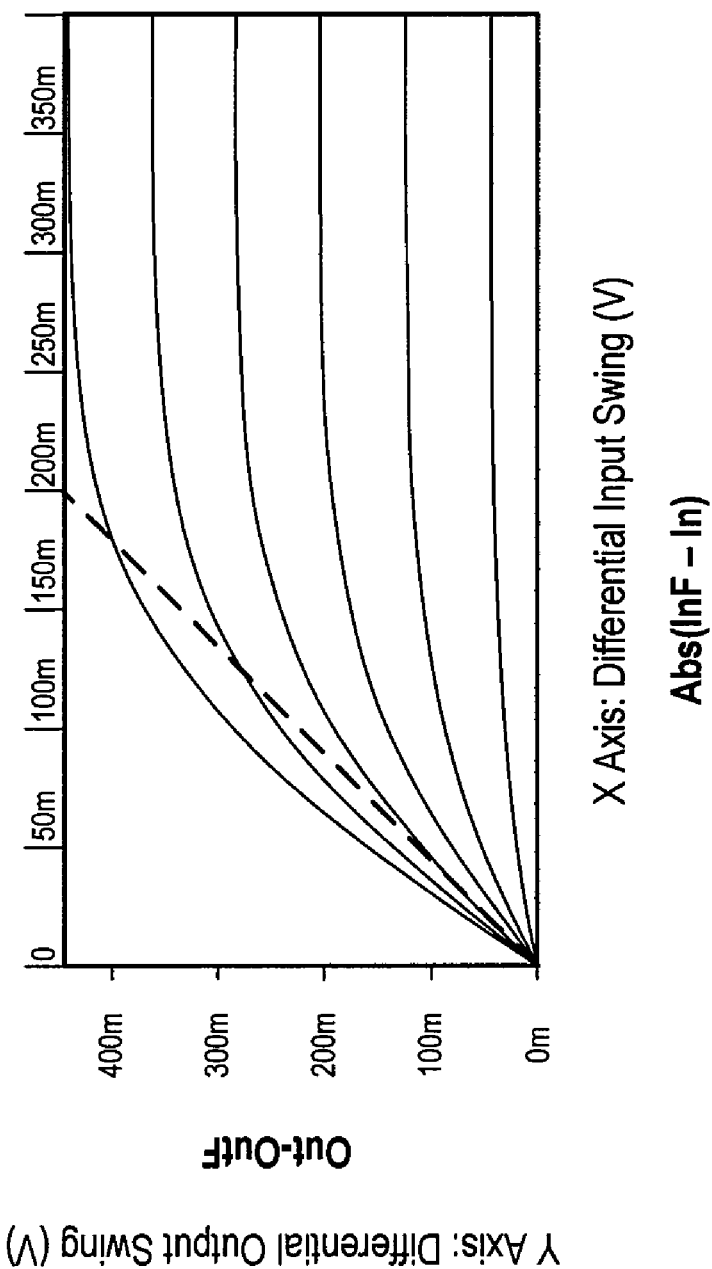
FIG. 6 is a chart illustrating the manner in which the analog delay line of FIG. 5 or an analog delay line according to some other embodiment may operate.

As can be seen from FIG. 6, as the differential current drawn by the current sink transistor 130 increases, the magnitude of the differential voltage for a given differential input voltage increases. However, the gain of the stage 112, i.e., the slope of the curve corresponding to a specific current drawn by the current sink transistor 130, decreases with increases in the differential input voltage. Thus, smaller amplitude input signals may be amplified to a greater extent than larger amplitude input signals. The points where the magnitude of the differential input signals are equal to the magnitudes of the corresponding differential output signals is where the gain of the delay stage 112 is unity. As shown in FIG. 6, these points form straight lines. The portions of the gain curves below the straight lines represent a gain of less than unity, and the portions of the gain curves above the straight lines represent a gain of greater than unity. With a gain greater than unity, the differential input signal is amplified to provide a larger differential output signal. Conversely, with a gain less than unity, the differential input signal is attenuated to provide a smaller differential output signal.

Insofar as the Bias voltage applied to the gate of the current sink transistor 130 in each of the delay stages 112 may be set to cause the delay stage to have a substantially unity gain at a differential output voltage amplitude corresponding to the SwingRef (FIG. 3), a differential input signal propagating though the delay line 110 will either be attenuated or amplified by each of the delay stages 112 in sequence until the amplitude of the output signal of the stage 112 is equal to the SwingRef voltage. The differential output signal may then propagate though any remaining stages with a substantially constant amplitude, and may be output from the final delay stage 112n with the magnitude of the differential output signal being substantially equal to the SwingRef voltage. For example, if the Bias voltage causes the current sink transistor 130 to set the delay stages 112 so they have a gain corresponding to the third curve, the output voltage will converge on a differential output voltage of 200 mv. If the amplitude of a differential signal applied to any stage 112 is less than 200 mv, the gain of the stages 112 in the delay line 100 will be greater than unity so that the signal will eventually be amplified to 200 mv. On the other hand, if the amplitude of a differential signal applied to any stage is greater than 200 mv, the gain of the stages 112 in the delay line 100 will be less than unity so that the signal will eventually be attenuated to 200 mv. If the gm of the input transistors 116, 118 change because, for example, temperature or supply voltage changes, the compensating circuit 150 may automatically adjust the bias voltage Bias to control the current drawn by the current sink transistor 130 so that the gain of the delay stages 112 are again substantially unity at a differential output voltage corresponding to the SwingRef voltage.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:

1. A transconductance compensating system, comprising:
    a bias voltage generator having first and second input transistors having respective sources coupled to each other, respective drains coupled to a first supply voltage node through respective loads, and respective gates, the gate of the first input transistor being coupled to the drain of the second input transistor and the first output node of the bias voltage generator, and the gate of the second input transistor being coupled to the drain of the first input transistor and the second output node of the bias voltage generator, the bias voltage generator configured to provide first and second differential output signals at respective first and second differential output nodes;
    a differential-to-single converter having first and second input nodes coupled to the first and second differential output nodes of the bias voltage generator, respectively, the differential-to-single converter configured to provide an output signal at an output node having a magnitude corresponding to the difference in the magnitude of the first and second differential output signals received from the bias voltage generator; and
    a comparison circuit coupled to the output node of the differential-to-single converter and to a reference voltage node and being configured to compare the magnitude of the output signal from the differential-to-single converter to the magnitude of a reference voltage provided to the reference voltage node and to provide at an output node a compensating signal corresponding to the comparison; and
    wherein the bias voltage generator further comprises a current sink transistor having a drain coupled to the sources of the first and second input transistors, a source coupled to a second supply voltage node, and a gate coupled to the output node of the comparison circuit.

2. The transconductance compensating system of claim 1 wherein the differential-to-single converter comprises:
    first and second input transistors having respective sources coupled to each other, respective drains coupled to the first supply voltage node through respective loads, and respective gates, the gate of the first input transistor being coupled to the drain of the first input transistor of the bias voltage generator, and the gate of the second input transistor being coupled to the drain of the second input transistor of the bias voltage generator;
    a current sink transistor having a drain coupled to the sources of the first and second input transistors, a source coupled to the second supply voltage node, and a gate coupled to the output node of the comparison circuit; and
    a load coupled to the drain of the second input transistor, the drain of the second input transistor being coupled to the output node of the differential-to-single converter.

3. The transconductance compensating system of claim 2 wherein the first and second input transistors of the differential-to-single converter have substantially the same electrical characteristics as each other and substantially the same electrical characteristics as the first and second input transistors of the bias voltage generator.

4. The transconductance compensating system of claim 2 wherein the current sink transistor of the differential-to-single converter has substantially the same electrical characteristics as the current sink transistor in the bias voltage generator.

5. A transconductance compensating system, comprising:
    a bias voltage generator having at least one transistor the bias voltage generator configured to provide first and second differential output signals at respective first and second differential output nodes;
    a differential-to-single converter having first and second in nodes coupled to the first and second differential output nodes of the bias voltage generator, respectively, the differential-to-single converter configured to provide an output signal at an output node having a magnitude corresponding to the difference in the magnitude of the first and second differential output signals received from the bias voltage generator; and
    a comparison circuit coupled to the output node of the differential-to-single converter and to a reference voltage node and being configured to compare the magnitude of the output signal from the differential-to-single converter to the magnitude of a reference voltage provided to the reference voltage node and to provide at an output node a compensating signal corresponding to the comparison, wherein the reference voltage comprises a voltage that is indicative of the magnitude of the differential output signals.

6. The transconductance compensating system of claim 5 wherein the differential amplifier comprises a first input coupled to the output node of the differential-to-single converter and a second input coupled to the reference voltage node.

7. A method of compensating a differential amplifier for a change in a transconductance of at least one input transistor in the differential amplifier, the method comprising:
  providing a bias signal having a magnitude that is a function of the transconductance of the at least one input transistor; and
  using the bias signal to adjust a gain of the differential amplifier to a gain of substantially unity at a particular magnitude of a differential input signal applied to the differential amplifier.

8. The method of claim 7 wherein the act of providing the bias signal comprises:
  constraining the gain of a compensating differential amplifier to a substantially unity gain;
  determining the magnitude of a differential output signal from the compensating differential amplifier; and
  using the determined magnitude to provide the bias signal.

9. The method of claim 7 wherein the act of constraining the gain of a compensating differential amplifier to a substantially unity gain comprises ensuring a magnitude of a differential input signal to the compensating differential amplifier is substantially equal to the magnitude of a differential output signal from the compensating differential amplifier.

* * * * *

UNITED STATES PATENT AND TRADEMARK OFFICE
CERTIFICATE OF CORRECTION

| | | |
|---|---|---|
| PATENT NO. | : 8,283,950 B2 | Page 1 of 1 |
| APPLICATION NO. | : 12/854749 | |
| DATED | : October 9, 2012 | |
| INVENTOR(S) | : Aaron Willey | |

It is certified that error appears in the above-identified patent and that said Letters Patent is hereby corrected as shown below:

In column 8, line 48, in Claim 5, delete "in" and insert -- input --, therefor.

Signed and Sealed this
Twenty-second Day of January, 2013

David J. Kappos
*Director of the United States Patent and Trademark Office*